United States Patent
Dejenfelt et al.

(10) Patent No.: US 6,711,063 B1
(45) Date of Patent: Mar. 23, 2004

(54) EEPROM MEMORY CELL ARRAY ARCHITECTURE FOR SUBSTANTIALLY ELIMINATING LEAKAGE CURRENT

(75) Inventors: Anders T. Dejenfelt, Palo Alto, CA (US); David Kuan-Yu Liu, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/264,203

(22) Filed: Oct. 3, 2002

(51) Int. Cl.[7] .............................................. G11C 16/06
(52) U.S. Cl. ........................ 365/185.21; 365/51; 365/63
(58) Field of Search ........................ 365/185.21, 185.05, 365/185.23, 185.33; 326/37, 38, 39

(56) References Cited

U.S. PATENT DOCUMENTS

| | | | | |
|---|---|---|---|---|
| 5,289,410 A | * | 2/1994 | Katti et al. .................. | 365/170 |
| 5,329,480 A | * | 7/1994 | Wu et al. .................... | 365/170 |
| 5,396,455 A | * | 3/1995 | Brady et al. ................... | 365/97 |
| 6,034,887 A | * | 3/2000 | Gupta et al. ................ | 365/171 |
| 6,140,838 A | * | 10/2000 | Johnson ........................ | 326/39 |
| 6,288,565 B1 | * | 9/2001 | Johnson ........................ | 326/37 |

* cited by examiner

Primary Examiner—Gene Auduong
(74) Attorney, Agent, or Firm—Scott R. Brown; Edel M. Young; Lois D. Cartier

(57) ABSTRACT

An EEPROM memory cell array architecture (50) that substantially eliminates leakage current to allow for reading memory cells (20) in a memory cell array of, for example, a CPLD at lower voltages than are possible with prior art architectures, thereby facilitating development of low voltage applications. This is accomplished by associating each wordline of the memory cell array with a ground transistor (26). On one embodiment, the ground transistor (26) can be a high voltage transistor, in which case the same high voltage control signal can control both the ground transistor (26) and the memory cell=s read transistor (32). In another embodiment, the ground transistor (26) is a low voltage transistor controlled by a separate low voltage control signal.

22 Claims, 4 Drawing Sheets

EEPROM MEMORY CELL ARRAY ARCHITECTURE FOR SUBSTANTIALLY ELIMINATING LEAKAGE CURRENT

FIELD OF THE INVENTION

The present invention relates to EEPROM memory cell array architectures such as are used, for example, in programmable logic devices (PLDs) such as complex programmable logic devices (CPLDs). More particularly, the present invention concerns a memory cell array architecture that substantially eliminates leakage current to allow for reading memory cells in a memory cell array of, for example, a CPLD at lower voltages than are possible with prior art architectures, thereby facilitating development of low voltage applications.

DESCRIPTION OF THE PRIOR ART

Referring to FIG. 1, a conventional electrically erasable programmable read-only memory (EEPROM) cell 20 is shown which is commonly used to implement embedded non-volatile memory circuitry in a CPLD, wherein the EEPROM cell 20 serves as a memory cell in an array of memory cells operable to store a designed configuration. As illustrated, each such EEPROM cell 20 broadly comprises a bitline read (BLrd) node 22; a bitline program (BLpr) node 24; a bitline ground (BLgrnd) node 26; an access gate (AG) node 28; an AG program transistor 30; an AG read transistor 32; a floating gate (FG) memory transistor 34; and a control gate (CG) node 36.

Referring also to FIG. 2, a prior art memory cell array architecture 40 is shown wherein a plurality of the EEPROM cells 20 are connected to bitlines 42 of programming paths and read paths. The BLrd nodes 22 of all of the EEPROM cells 20 in each bitline 42 are connected to a sense amplifier (sense-amp) 46. The BLgrnd nodes 26 of all of the EEPROM cells 20 in the bitline 42 are connected together and to a common ground. The result is that all leakage currents from unselected EEPROM cells 20 are added together along bitline 42. In order to keep the total leakage current sufficiently low, so as not to trip the sense amplifier 46, the threshold voltage (Vt) of read access gate transistor 32 needs to be sufficiently high, or about 0.8V. Consequently, in order to reliably read a selected cell, this requires that the gate voltage on access gate node 28, or Vdd, to be sufficiently high. The power supply Vdd would therefore need to be such that Vg−Vt=Vdd−Vt=1.0V, or Vdd=0.8+1.0=1.8V.

Current trends toward lower $V_{dd}$ in integrated circuit electronics pose new challenges to circuit implementation. One problem that has arisen, for example, is that threshold voltages (Vt) in CMOS transistors, such as, for example, the EEPROM cell AG read transistor 32, cannot fall below a certain lower limit without giving rise to undesirable off-state leakage currents. This limitation is encountered when reading the EEPROM cells 20 using the sense-amp 46.

In the prior architecture 40, the read path bitlines 42, in which the AG transistor 32 of each EEPROM cell 20 is connected in series with its FG memory transistor 34, are connected in parallel. The sense-amp 46 triggers at a bitline current of approximately 6 $\mu$A. When $V_{dd}$=1.8V and $V_t$=0.8V for the AG read transistor 32, gate voltage ($V_g$)−$V_t$=1.0V. With this drive voltage, the EEPROM cells 20 will deliver sufficient read current, approximately 15 $\mu$A, to reliably trigger the sense-amp 46. Maximum allowable leakage current from a non-selected EEPROM cell 20, however, can be no more than the total bitline leakage current, which is less than approximately 1 $\mu$A, so that the leakage current doesn't trigger the sense-amp 46. Because each bitline 42 may include, for example, 100 EEPROM cells 20 connected in parallel, the maximum leakage current per EEPROM cell 20 must be less than 10 nA.

Furthermore, because reading of the memory cell array is triggered on power-up of the CPLD, the $V_{dd}$ at the time of power-on reset (POR) will be lower than the target $V_{dd}$ by approximately 0.4V, making $V_{dd}$=1.4V at power-up. Therefore, the maximum allowable read current for a selected programmed (low $V_t$) EEPROM cell 20 is $$I_{read} > \sim 10 \mu A \text{ when } V_{dd} = 1.4V.$$

At the same time, the EEPROM cell 20 must not exceed the maximum allowable leakage current for an unselected EEPROM cell 20, which, as mentioned, is $$\text{maximum } V_{dd} = 1.9V \text{ so } I_{off} < 10 \text{ nA}.$$

It is possible to accomplish this with an AG read transistor 32 having a $V_t$ of 0.8V. Unfortunately, lowering the $V_t$ increases the leakage current by approximately one order of magnitude per 0.1$V_t$ shift, making it practically impossible to lower the $V_t$ of the AG read transistor 32 below 0.8V without risking a read failure due to the EEPROM cell read path bitline leakage current. Thus, with prior art architectures, it is not possible to meet read reliability requirements as $V_{dd}$ is lowered below 1.8V.

Due to the above-identified and other problems and disadvantages in the art, there exists a distinct need for an improved memory cell array architecture.

SUMMARY OF THE INVENTION

The present invention solves the above-described and other problems and disadvantages in the prior art to provide a memory cell array architecture that substantially eliminates leakage current to allow for reading memory cells in a memory cell array at lower voltages than are possible with prior art architectures, thereby advantageously facilitating development of low voltage applications, particularly handheld low voltage battery-powered devices. The architecture may be used, for example, to implement embedded non-volatile memory circuitry in a PIC device such as a CPLD, wherein the memory cells are conventional EEPROM cells.

In the architecture of the present invention, all of the BLgrnd nodes of the EEPROM cells in the same wordline are connected together in a common BLgrnd line, and each common BLgrnd line is connected through a select transistor to ground. In one embodiment, the select transistor is driven by the same high voltage wordline (HV WL) signal used to select the AG read transistor of each EEPROM cell in the wordline. This results in all unselected EEPROM cells in each bitline having floating BLgrnd nodes, thereby eliminating the off-state leakage current contribution from unselected EEPROM cells. The $V_t$ of the AG read transistor can then be reduced from 0.8V to a significantly lower value, such as, for example, between approximately 0.4V and 0.5V, thereby allowing the EEPROM cell to be successfully read at a correspondingly lower $V_{dd}$ voltage. Furthermore, since the access gate read transistor 32 and the access gate programming transistor 30 typically have the same Vt's, the lower Vt of the AG programming transistor 30 results in a lowered voltage drop across the AG programming transistor, which results in a corresponding improvement in the programming efficiency of the cell and a lower programmed Vt of the FG memory transistor 34, in turn leading to a higher read current in a selected cell.

Thus, it will be appreciated that the memory cell array architecture of the present invention provides a number of substantial advantages over prior art architectures, including, for example, that the leakage current contribution from unselected EEPROM cells is advantageously eliminated. Furthermore, the architecture advantageously allows for reducing the $V_t$ of the AG read and programming transistors from 0.8V to a significantly lower value, such as, for example, approximately between 0.4V and 0.5V, thereby allowing the EEPROM cell to be successfully read at a correspondingly lower $V_{dd}$ voltage. Additionally, the lower $V_t$ of the AG programming transistor of each EEPROM cell allows for improved cell programming because the voltage drops across the AG programming transistor is reduced, which results in a corresponding improvement in the programmed $V_t$ of the FG memory transistor.

These and other important features of the present invention are more fully described in the DETAILED DESCRIPTION below.

BRIEF DESCRIPTION OF THE DRAWINGS

A preferred embodiment of the present invention is described in detail below with reference to the attached drawing figures, wherein.

DETAILED DESCRIPTION OF A PREFERRED EMBODIMENT

Figure 1:
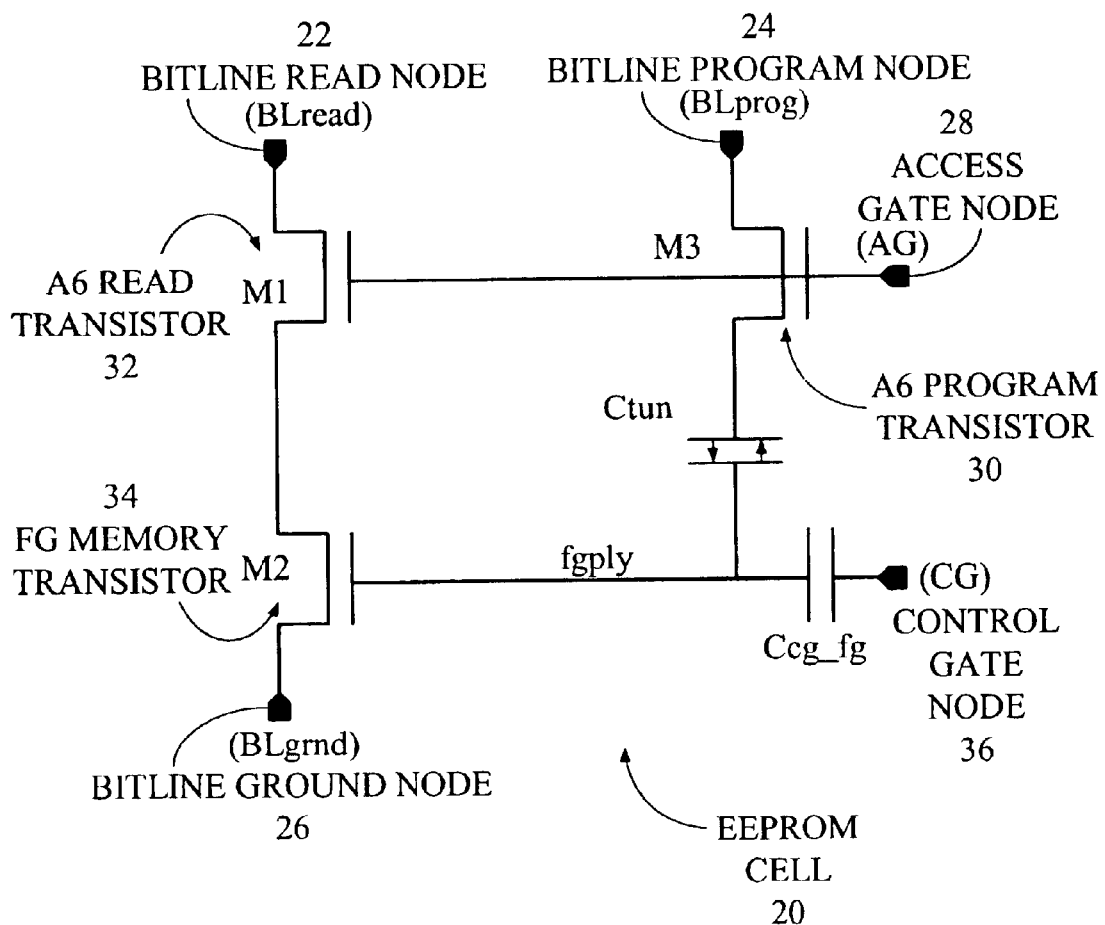
FIG. 1 is a circuit schematic of a conventional EEPROM cell.
Figure 2:
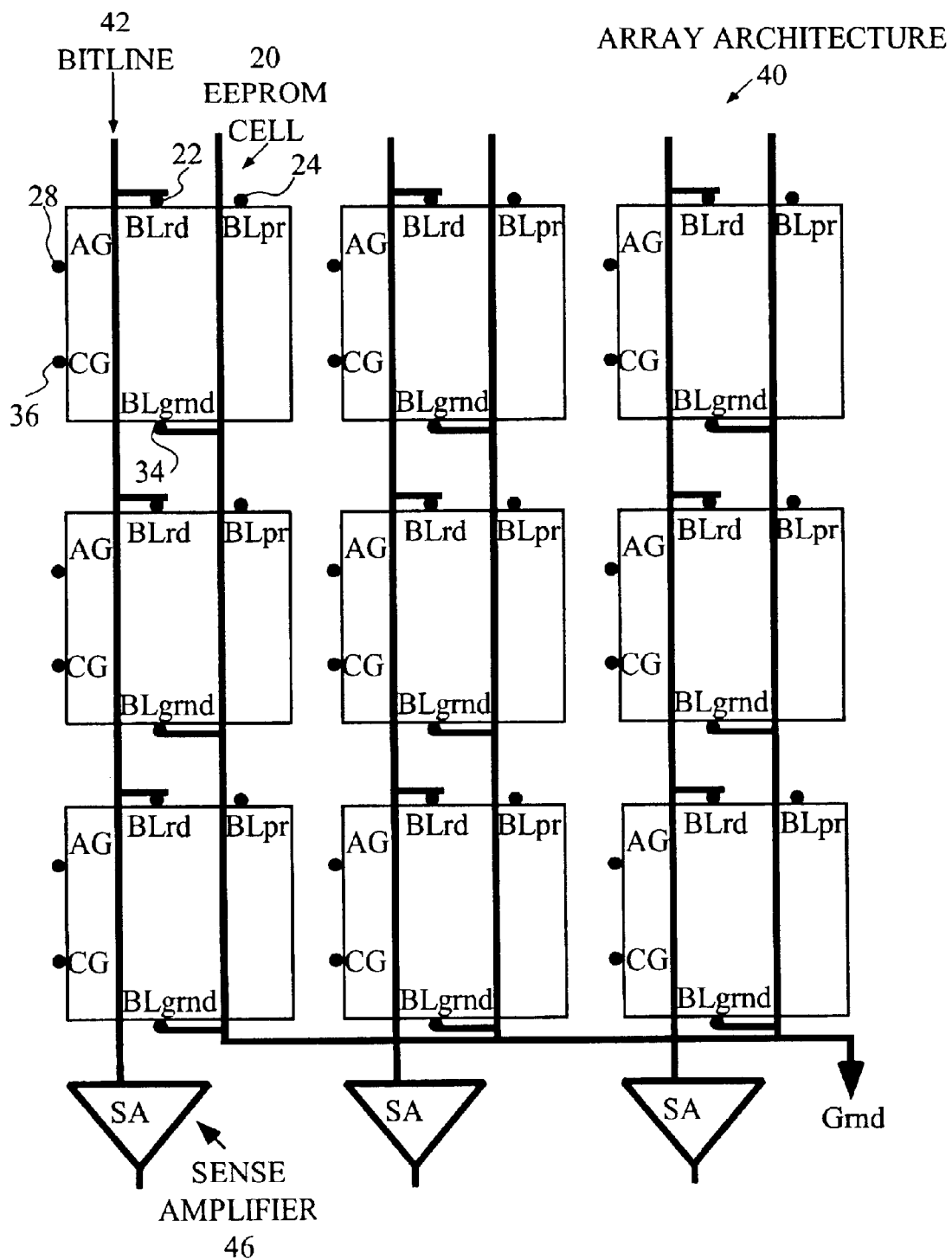
FIG. 2 is a circuit schematic of a prior art EEPROM cell array architecture.
Figure 3:
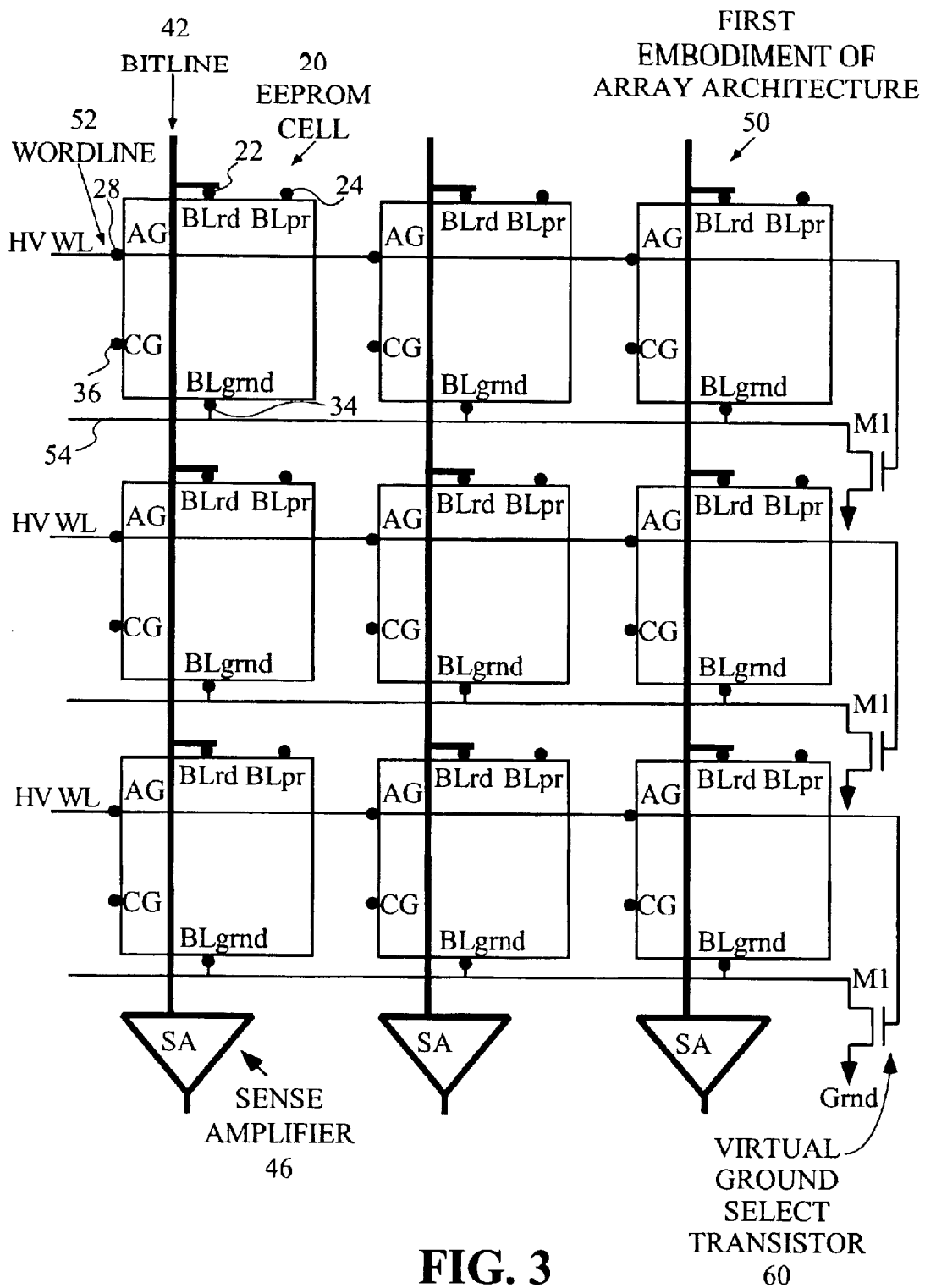
FIG. 3 is a circuit schematic of a first embodiment of the EEPROM cell array architecture of the present invention, wherein a virtual ground connection is provided by an HV NMOS select transistor.

Referring to FIG. 3, a memory cell array architecture 50 is shown constructed in accordance with a first embodiment of the present invention. The architecture 50 substantially eliminates leakage current to allow for reading memory cells 20 in a memory cell array at lower voltages than are possible with prior art architectures 40 (see, for example, FIG. 2 and the discussion above), thereby advantageously facilitating development of low voltage applications, particularly hand-held low voltage battery-powered devices. As illustrated, the architecture 50 may be used to implement embedded non-volatile memory circuitry in a PLD device such as a CPLD, wherein the memory cells 20 are conventional EEPROM cells 20 (see FIG. 1 and the discussion above).

Referring to FIG. 2, in prior art architectures, all of the BLgrnd nodes 34 of the EEPROM cells 20 in a bitline 42 are connected together and connected to a common ground. The result is that all leakage currents from unselected EEPROM cells 20 are added together, thereby requiring a relatively high $V_{dd}$ or risk exceeding the maximum allowable leakage current.

Referring again to FIG. 3, in the architecture 50 of the present invention, all of the BLgrnd nodes 34 of the EEPROM cells 20 in the same wordline 52 are connected together in a common BLgrnd line 54, and each virtual ground common BLgrnd line 54 is connected through a select transistor 56 to ground. In this first embodiment, the select transistor 60 is driven by the same wordline (HV WL) signal used to select the AG transistors 30,32 of each EEPROM cell 20 in the wordline 52. This results in all unselected EEPROM cells 20 in each bitline 42 having floating virtual ground BLgrnd nodes 34, thereby eliminating the off-state leakage current contribution from unselected EEPROM cells 20. For a selected EEPROM cell 20, the vitual ground BLgrnd node 34 is connected to ground.

This simplifies the EEPROM cell requirements in that the leakage current from a selected erased EEPROM cell 20 must now be less than 100 nA and the read current from a selected programmed EEPROM cell 20 must now be greater than 10 μA. Because this current ratio is only a factor of 100, it becomes possible to reduce the $V_t$ of the AG read transistor 32 from 0.8V to a significantly lower value, such as, for example, between approximately 0.4V and 0.5V, thereby allowing the EEPROM cell 20 to be successfully read at a correspondingly lower $V_{dd}$ voltage.

Furthermore, the lower $V_t$ of the AG programming transistor 30 of each EEPROM cell 20 allows for improved cell programming because the voltage drop across the AG programming transistor 30 is reduced, which results in a corresponding improvement in the programmed $V_t$ of the FG memory transistor 34

With regard to the select transistors 60, it is required that they not limit the read current, and that, for an unselected wordline 52, the leakage current $1_{off}$ be less than 10 nA. This is accomplished by making the width and the length of virtual ground select transistor 60 sufficiently large.

In the first embodiment, the select transistors 60 are high voltage (HV) NMOS transistors. This may be the most straightforward implementation because, as mentioned, the same HV WL signal that selects the AG read transistors 32 of the EEPROM cells 20 of each wordline 52 can be used to drive the select transistor 60. For some applications, however, given that the select transistors 60 must carry the total read current of all of the EEPROM cells 20 along the wordline 52, the physical size of the select transistors 60 could be substantial.

Figure 4:
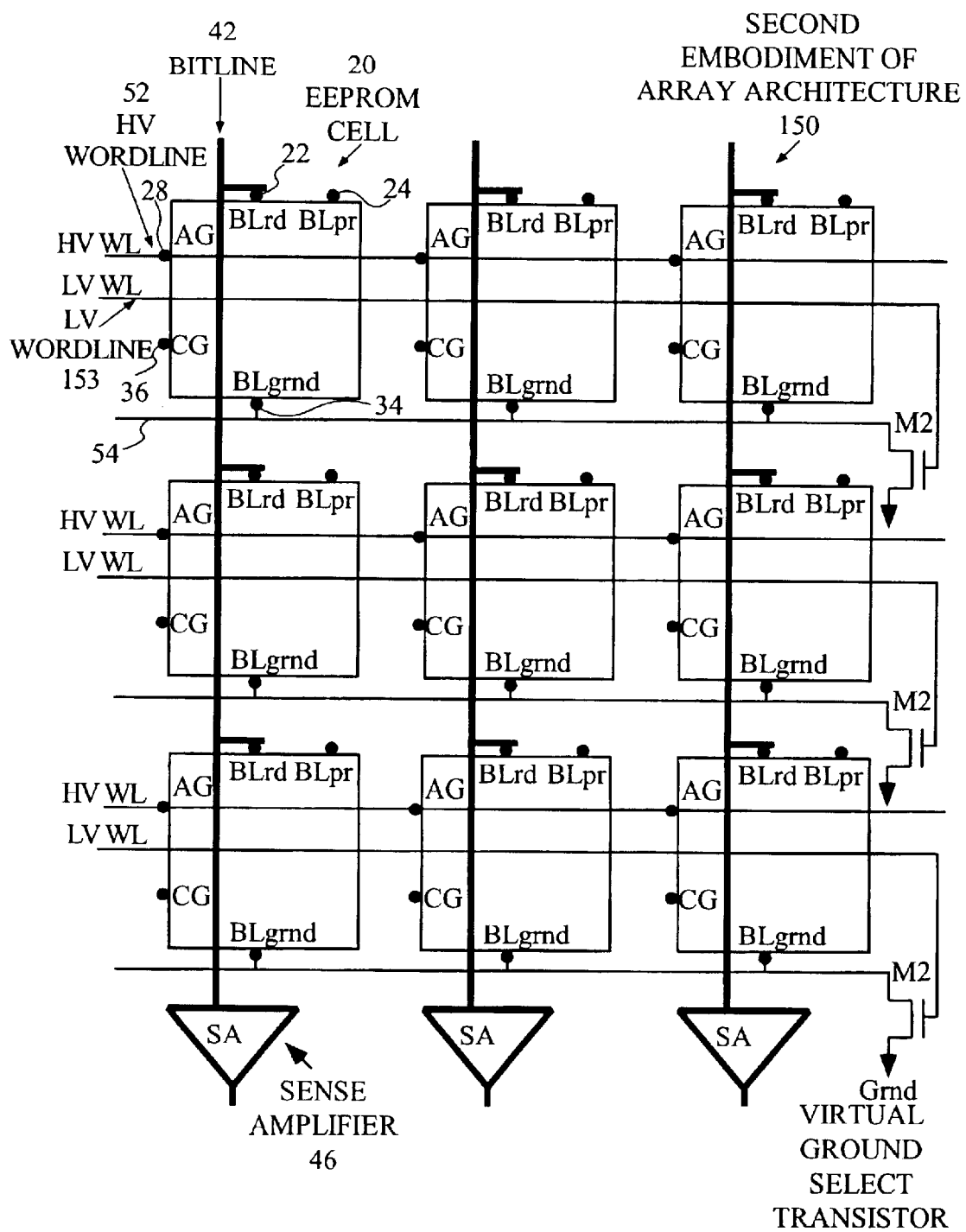
FIG. 4 is a circuit schematic of a second embodiment of the EEPROM cell array architecture of the present invention, wherein the virtual ground connection is provided by an LV NMOS select transistor.

Referring also to FIG. 4, in the second embodiment of the array architecture 150, if it is desirable that the physical size of the select transistors 60 be minimized, the select transistors 60 are low voltage (LV) NMOS transistors. This is possible because the maximum voltage in the read path is $V_{dd}$. In this second embodiment, however, the select transistors 60 must be driven by a separate low voltage wordline (LV WL) signal on a low voltage wordline 153 rather than the HV WL signal of the first embodiment.

From the preceding description, it will be appreciated that the various preferred embodiments of the memory cell array architecture 50 of the present invention provide a number of substantial advantages over prior art architectures 40, including, for example, that the leakage current contribution from unselected EEPROM cells 20 is advantageously eliminated. Furthermore, the architecture 50 advantageously allows for reducing the $V_t$ of the AG read transistors 32 from 0.8V to a significantly lower value, such as, for example, approximately between 0.4V and 0.5V, thereby allowing the EEPROM cell 20 to be successfully read at a correspondingly lower $V_{dd}$ voltage. Additionally, the lower $V_t$ of the AG programming transistor 30 of each EEPROM cell 20 allows for improved cell programming because the voltage drop across the AG programming transistor 30 is reduced, which results in a corresponding improvement in the $V_t$ of the FG memory transistor 34.

Although the invention has been described with reference to the preferred embodiments illustrated in the attached drawings, it is noted that equivalents may be employed and substitutions made herein without departing from the scope of the invention as recited in the claims.

What is claimed is:

1. A memory array architecture comprising:
   a memory cell having a read node, an access node, and a ground node, wherein the memory cell is associated with both a bitline and a wordline;
   a sense amplifier associated with the bitline;
   a ground transistor associated with the wordline;
   a first connection connecting the read node of the memory cell associated with the bitline to the sense amplifier;
   a second connection connecting the access node of the memory cell of the wordline to a first terminal of the ground transistor; and
   a third connection connecting the ground node of the memory cell of the wordline to a second terminal of the ground transistor.

2. The memory array architecture as set forth in claim 1, wherein the memory cell is an electrically erasable programmable read-only memory.

3. The memory array architecture as set forth in claim 1, wherein the ground transistor is a high voltage NMOS transistor.

4. The memory array architecture as set forth in claim 1, wherein the memory cell further includes a read transistor connected to the access node, and the read transistor and the ground transistor are both controlled by a single control signal propagated on the second connection.

5. The memory array architecture as set forth in claim 4, wherein the read transistor has a threshold voltage which is lower than approximately 0.8V.

6. A memory array architecture comprising:
   a memory cell having a read node, an access node, a ground node, and a read transistor connected to the access node and having a threshold voltage which is lower than approximately 0.8V, wherein the memory cell is associated with both a bitline and a wordline;
   a sense amplifier associated with the bitline;
   a high voltage ground transistor associated with the wordline;
   a first connection connecting the read node of the memory cell of the bitline to the sense amplifier;
   a second connection connecting the access node of the memory cell of the wordline to a first terminal of the ground transistor; and
   a third connection connecting the ground node of the memory cell of the wordline to a second terminal of the ground transistor, wherein the read transistor and the ground transistor are both controlled by a single control signal propagated on the second connection.

7. The memory array architecture as set forth in claim 6, wherein the memory cell is an electrically erasable programmable read-only memory.

8. A memory array architecture comprising:
   a memory cell having a read node and a ground node, wherein the memory cell is associated with both a bitline and a wordline;
   a sense amplifier associated with the bitline;
   a ground transistor associated with the wordline;
   a first connection connecting the read node of the memory cell associated with the bitline to the sense amplifier;
   a second connection connected to a first terminal of the ground transistor and adapted to propagate a low voltage control signal thereto; and
   a third connection connecting the ground node of the memory cell of the wordline to a second terminal of the ground transistor.

9. The memory array architecture as set forth in claim 8, wherein the memory cell is an electrically erasable, programmable read-only memory.

10. The memory array architecture as set forth in claim 8, wherein the ground transistor is a low voltage NMOS transistor controlled by a low voltage control signal.

11. The memory array architecture as set forth in claim 8, wherein the memory cell further includes a read transistor connected to the access node, and the read transistor is controlled by a high voltage control signal.

12. The memory array architecture as set forth in claim 11, wherein the read transistor has a threshold voltage which is lower than approximately 0.8V.

13. A memory array architecture comprising:
   a memory cell having a read node, an access node, a ground node, and a read transistor connected to the access node and having a threshold voltage which is lower than approximately 0.8V, wherein the memory cell is associated with both a bitline and a wordline;
   a sense amplifier associated with the bitline;
   a low voltage ground transistor associated with the wordline;
   a first connection connecting the read node of the memory cell of the bitline to the sense amplifier;
   a second connection connected to the read transistor via the access node and adapted to propagate a high voltage control signal thereto;
   a third connection connected to a first terminal of the ground transistor and adapted to propagate a low voltage control signal thereto; and
   a fourth connection connecting the ground node of the memory cell of the wordline to a second terminal of the ground transistor.

14. The memory array architecture as set forth in claim 13, wherein the memory cell is an electrically erasable programmable read-only memory.

15. A method of implementing memory array circuitry, wherein the memory array circuitry includes a memory cell having a read node, an access node, a ground node, and a read transistor connected to the access node, and wherein the memory cell is associated with both a bitline and a wordline, the method comprising the steps of:
   (a) connecting with a first connection the read node of the memory cell of the bitline to a sense amplifier;
   (b) connecting with a second connection the access node of the memory cell of the wordline to a first terminal of a ground transistor;
   (d) connecting with a third connection the ground node of the memory cell of the wordline to a second terminal of the ground transistor; and
   (d) controlling the read transistor and the ground transistor with a single control signal propagated on the second connection.

16. The method of claim 15, wherein the memory cell is an electrically erasable programmable read-only memory.

17. The method of claim 15, wherein the ground transistor is a high voltage NMOS transistor.

18. The method of claim 15, wherein the read transistor has a threshold voltage which is lower than approximately 0.8V.

19. A method of implementing memory array circuitry, wherein the memory array circuitry includes a memory cell having a read node, an access node, a ground node, and a read transistor connected to the access node, and wherein the memory cell is associated with both a bitline and a wordline, the method comprising the steps of:

(a) connecting the read node of the memory cell of the bitline to a sense amplifier with a first connection;

(b) controlling the read transistor of the memory cell of the wordline with a high voltage control signal;

(c) connecting the ground node of the memory cell of the wordline to a terminal of the ground transistor with a second connection; and (d) controlling the ground transistor with a low voltage control signal.

20. The method of claim 19, wherein the memory cell is an electrically erasable programmable read-only memory.

21. The method of claim 19, wherein the ground transistor is a low voltage NMOS transistor.

22. The method of claim 19, wherein the read transistor has a threshold voltage which is lower than approximately 0.8V.

* * * * *